(12) United States Patent
Park

(10) Patent No.: US 8,609,013 B2
(45) Date of Patent: Dec. 17, 2013

(54) METHOD OF FABRICATING A MICROFABRICATED STRUCTURE

(75) Inventor: Jong Jin Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 508 days.

(21) Appl. No.: 12/805,963

(22) Filed: Aug. 26, 2010

(65) Prior Publication Data

US 2010/0323298 A1 Dec. 23, 2010

Related U.S. Application Data

(62) Division of application No. 12/230,221, filed on Aug. 26, 2008, now Pat. No. 7,803,514.

(30) Foreign Application Priority Data

Feb. 19, 2008 (KR) ........................ 10-2008-0014796

(51) Int. Cl.
  *B29C 35/08* (2006.01)
  *B29C 41/02* (2006.01)
  *B29C 71/02* (2006.01)

(52) U.S. Cl.
  USPC .......................... 264/401; 264/234; 264/494

(58) Field of Classification Search
  USPC ......................................... 264/234, 401, 494
  See application file for complete search history.

(56) References Cited

U.S. PATENT DOCUMENTS

| 6,391,523 | B1 | 5/2002 | Hurditch et al. |
| 6,534,235 | B1 | 3/2003 | Hanabata et al. |
| 6,630,287 | B2 | 10/2003 | Towata |
| 7,611,823 | B1 | 11/2009 | Belfield |
| 2002/0171176 | A1 * | 11/2002 | Hanna .......................... 264/401 |
| 2004/0224252 | A1 | 11/2004 | Kondo et al. |
| 2005/0260522 | A1 | 11/2005 | Weber et al. |
| 2008/0020317 | A1 | 1/2008 | Park et al. |
| 2008/0166670 | A1 | 7/2008 | Park et al. |

FOREIGN PATENT DOCUMENTS

| KR | 10-2003-0031089 | 4/2003 |
| KR | 10-2006-0027746 | 3/2006 |

OTHER PUBLICATIONS

Wenhui Zhou et al., "An Efficient Two-Photon-Generated Photoacid Applied to Positive—Tone 3D Micofabrication", Science 296, 1106-1109 (2002).

Tianyue Yu et al., "Chemical Amplified Positive Resists for Two-Photon Three Dimensional Microfabrication", Adv. Mater. 2003, 15, No. 6, March 17.

Jong-Jin Park et al., "Formation of Silver Nanoparticles in Photosensitive Components: Control of Size and Microfabrication", Nano Korea 2007; p. 410, Aug. 29-31, 2007.

* cited by examiner

*Primary Examiner* — Leo B Tentoni
(74) *Attorney, Agent, or Firm* — Harness, Dickey & Pierce, P.L.C.

(57) ABSTRACT

Disclosed herein may be a photosensitive composition, a microfabricated structure including the same, a device including the microfabricated structure, and methods of fabricating the microfabricated structure and the device. The photosensitive composition, including a multifunctional photosensitive resin, a two-photon photosensitizer, an organic solvent, and a silver compound, may be subjected to two- or three-dimensional microfabrication, thus realizing the microfabricated structure containing silver nanoparticles.

5 Claims, 3 Drawing Sheets

METHOD OF FABRICATING A MICROFABRICATED STRUCTURE

PRIORITY STATEMENT

This application is a divisional of and claims priority under 35 U.S.C. §121 on U.S. patent application Ser. No. 12/230,221, now U.S. Pat. No. 7,803,514, filed on Aug. 26, 2008, which claims priority under 35 U.S.C. §119 to Korean Patent Application No. 2008-14796, filed on Feb. 19, 2008, the entire contents of each of which are incorporated herein by reference.

BACKGROUND

1. Field

Example embodiments are directed to a photosensitive composition, a microfabricated structure including the same, a device including the microfabricated structure, and methods of fabricating the microfabricated structure and the device. Other example embodiments are directed to a photosensitive composition, a microfabricated structure including the same, a device including the microfabricated structure, the fabrication of a three-dimensional microstructure on a nanometer or micrometer scale, and a method of fabricating a device.

2. Description of the Related Art

Scientific technology, which is essentially required for the development of high-performance complex information products in the future, may include techniques for increasing the usability of various information media in nano fields. In the new field of NEMS (nano electro mechanical systems) as well as the development of nano electronic devices for use with electrical nano information media, research into complex information devices for handling machines, thermal fluids, light waves, and biochemical nano information media in addition to the electrical nano information media may be conducted. The range of NEMS techniques for handling the nano information media in various forms may be extended through a combination of newly discovered nanoscience knowledge in the nano fields and a microfabrication process for a three-dimensional microstructure.

The fabrication of three-dimensional microstructures including respective nanometer-sized elements may be more difficult than the synthesis of nano material. The development of fabrication methods on a nanometer or micrometer scale may be important for extending the range not only of MEMS (micro electro mechanical systems) but also of NEMS.

The structure patterned on a nanometer scale through such a fabrication method has surface plasmon resonance, which may be a characteristic unique to metal nanoparticles, and may be thus variously applied to all kinds of electronic devices and optical devices. In the two- or three-dimensional fabrication process, efforts have been made to assure precision on a nanometer or micrometer level.

SUMMARY

Example embodiments provide a photosensitive composition, which may enable a uniform distribution of silver nanoparticles after microfabrication and an improvement in precision. Example embodiments also provide a microfabricated structure on a nanometer or micrometer scale, in which silver nanoparticles may be uniformly dispersed, and a device including the microfabricated structure. Example embodiments also provide a two- or three-dimensional fabrication method of a microfabrication structure, which may improve precision on a nanometer or micrometer scale. Other example embodiments provide a method of fabricating a device including the same.

In example embodiments, a photosensitive composition may be provided, which may include a multifunctional photosensitive resin, a two-photon photosensitizer, an organic solvent, and a silver compound. In other example embodiments, a microfabricated structure may include silver nanoparticles including the photosensitive composition according to example embodiments. In other example embodiments, a device may include the microfabricated structure of example embodiments.

In other example embodiments, a method of fabricating a microfabricated structure may be provided, which may include preparing the aforementioned photosensitive composition, and subjecting a portion of the photosensitive composition to microfabrication under conditions effective for two- or three-dimensional fabrication. In other example embodiments, a method of fabricating a device may include fabricating the microfabricated structure.

BRIEF DESCRIPTION OF THE DRAWINGS

Example embodiments will be more clearly understood from the following detailed description taken in conjunction with the accompanying drawings.

FIG. 1 is an exemplary schematic view illustrating a system for realizing a microfabrication process according to example embodiments;

FIG. 2 is an SEM image illustrating the three-dimensional microstructure fabricated in Example 1; and FIG. 3 is an SEM image illustrating the surface of the three-dimensional microstructure fabricated in Example 1.

Figure 1:
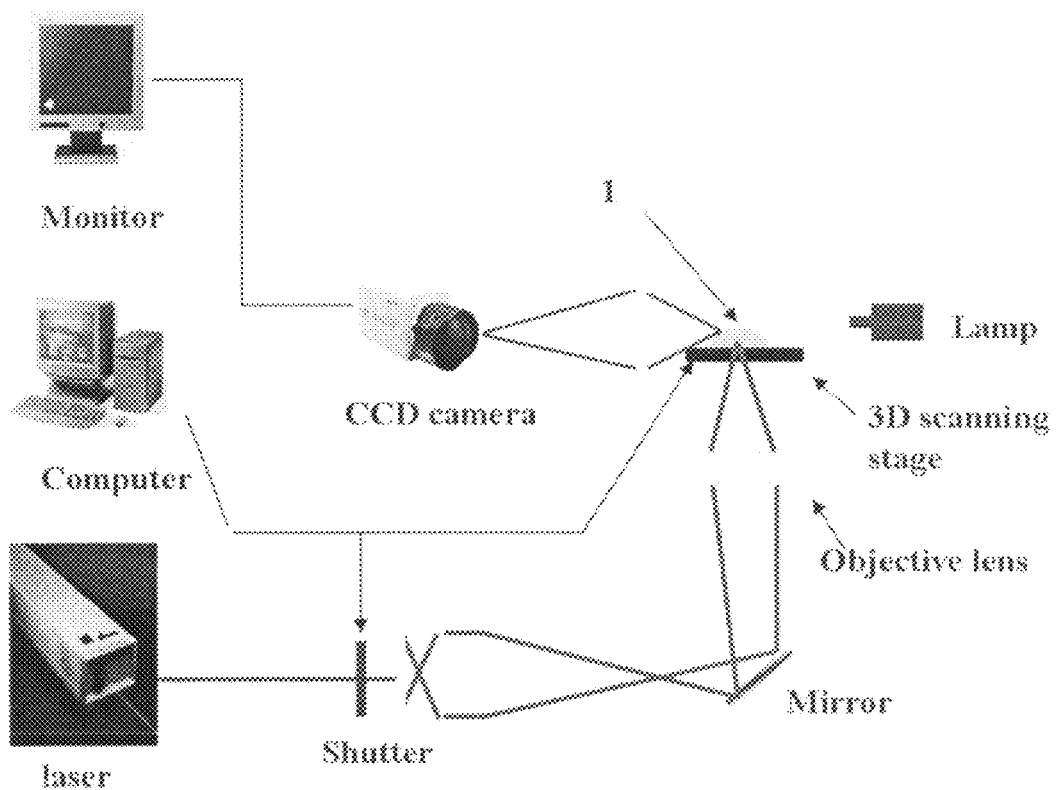
FIGS. 1-3 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, a detailed description will be given of example embodiments with reference to the accompanying drawings. In the drawings, the thicknesses of layers and regions are exaggerated for clarity, and the same reference numerals in the drawings denote the same element.

The term "microfabrication" as used herein is a concept that includes fabrication on a nanometer or micrometer level, including microfabrication and nanofabrication.

The term "fabrication" as used herein is a concept that includes surface micromachining, bulk micromachining, nanomachining, and laser micromachining.

The term "microfabricated structure" as used herein is a concept that includes one or more structures occupying a two- or three-dimensional space, including a structure fabricated on a nanometer or micrometer scale. The term "two-dimensional" means on a surface in either vertical or horizontal space.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In accordance with example embodiments, a photosensitive composition may include a multifunctional photosensitive resin, a two-photon photosensitizer, an organic solvent, and a silver compound.

Because the photosensitive composition includes the two-photon photosensitizer, a microfabrication method using the above composition makes improvement in the precision possible. One-photon absorption may increase or decrease linearly depending on the intensity of incident light, whereas the absorption of two photons shows a quadratic dependence on the intensity of incident light. The number of photons absorbed may increase as the intensity of incident light increases. Because two-photon absorption involves the simultaneous absorption of two photons, even if respective photons have insufficient energy to excite molecules, selectively exciting molecules present at deeper positions in the material using a depth-focused light source may be possible, compared to one-photon absorption. According to a laser microfabrication method based on two-photon absorption, only portions having relatively high peak power of laser light may receive and absorb two-photon energy. Accordingly, two-photon absorption may be utilized to cure only portions around the focal points of laser light, and, as a result, precision on the order of tens of nanometers may be achieved, and a three-dimensional structure with a relatively high spatial resolution may also be formed.

The use of the photosensitive composition may enable the formation of a microfabricated structure in which silver nanoparticles may be uniformly dispersed through a relatively simple process. In the course of microfabrication of the composition, through electron transfer by a radical generated from the two-photon photosensitizer or other materials, the silver compound may be photoreduced, thus forming the silver nanoparticles. Thus, the silver nanoparticles dispersed in the polymer resin may not aggregate with each other, but may be uniformly dispersed. Consequently, compared to conventional microfabrication methods including the dispersion of silver nanoparticles in the composition itself, the microfabrication method according to example embodiments may improve the dispersibility of the silver nanoparticles, and also, the microfabricated structure obtained therewith may be further increased in terms of physical and chemical properties, including heat resistance, thermal conductivity, wear resistance, and dispersibility.

The multifunctional epoxy resin may not be particularly limited, but may include one or more selected from the group consisting of multifunctional epoxy resins and multifunctional acrylate resins. The multifunctional epoxy resin may not be particularly limited, but may include any resin having two or more functional groups and containing an oxirane group. Specific examples thereof may include, but may be not limited to, bisphenol A type epoxy resins, bisphenol F type epoxy resins, hydroquinone type epoxy resins, resorcinol type epoxy resins, and novolac type epoxy resins, which may be used alone or in mixtures of two or more thereof. Commercially available examples of the epoxy resin may include EPON 828, EPON 1004, EPON 1001F, EPON 1010, and EPON SU-8, available from Shell Chemicals, DER-331, DER-332, DER-334, DEN-431, and DEN-439, available from Dow Chemical Company, and ERL-4201, ERL-4289, and ERL-0400, available from Union Carbide Corporation.

The amount of the multifunctional epoxy resin may be determined according to an appropriate choice made by one skilled in the art depending on the end use and need, and may be set in the range of about 15~ about 90 wt %, for example, about 30~ about 75 wt %, based on the total amount of the photosensitive composition. As such, an amount of the epoxy resin of about 15 wt % or more may enable the formation of a more rigid film, and an amount thereof of about 90 wt % or less may result in improved thermal conductivity.

The multifunctional acrylate resin may include any resin having three or more functional groups and containing an acryl group, and examples thereof may include one or more selected from the group consisting of, but not limited to, urethane acrylate, trimethylolpropane triacrylate, ethyleneglycol diacrylate, triethyleneglycol diacrylate, 1,4-butanediol diacrylate, 1,6-hexanediol diacrylate, neopentylglycol diacrylate, pentaerythritol diacrylate, pentaerythritol triacrylate, dipentaerythritol diacrylate, dipentaerythritol triacrylate, dipentaerythritol pentaacrylate, dipentaerythritol hexaacrylate, bisphenol A diacrylate, trimethylolpropane triacrylate, novolac epoxy acrylate, ethyleneglycol dimethacrylate, diethyleneglycol dimethacrylate, triethyleneglycol dimethacrylate, propyleneglycol dimethacrylate, 1,4-butanediol dimethacrylate, and 1,6-hexanediol dimethacrylate.

The amount of the multifunctional acrylate resin may not be particularly limited, but may be set to about 1~ about 20 wt %, for example, about 1~about 10 wt %, from the point of view of solubility and mechanical strength.

The two-photon photosensitizer may not be particularly limited, and may include those typically used in the art. Examples of the two-photon photosensitizer having relatively large cross-sectional area for absorbing multi-photons are materials represented by Formula 1 below:

Formula 1

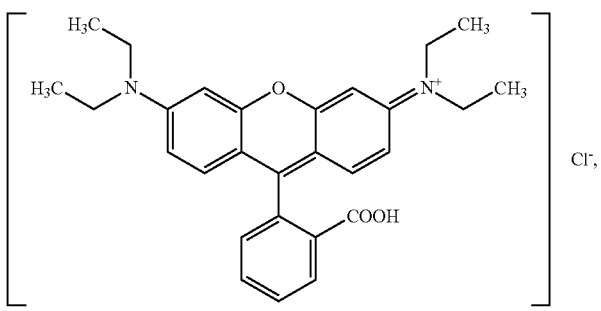

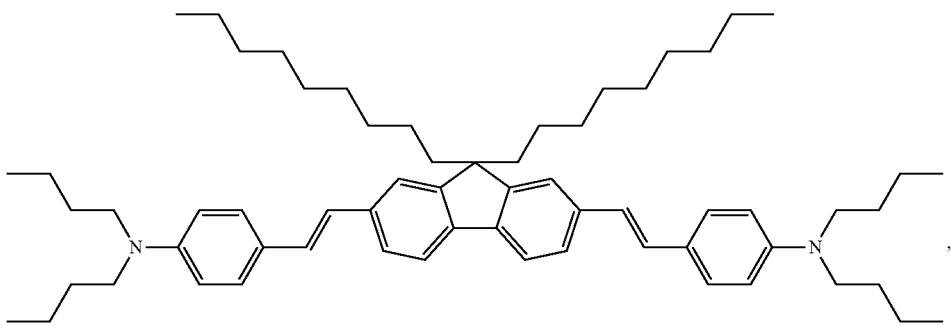

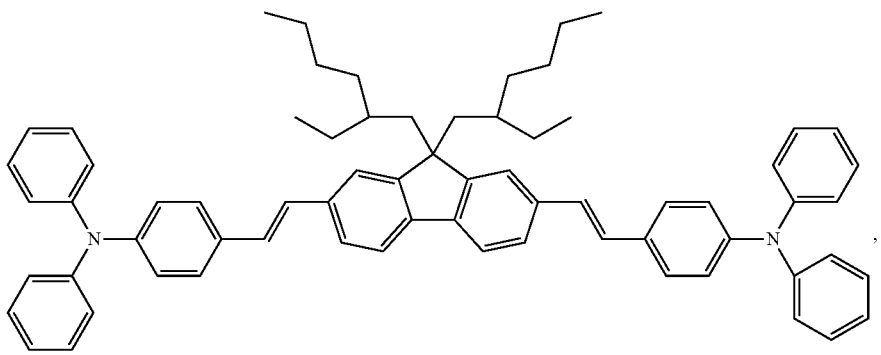

-continued
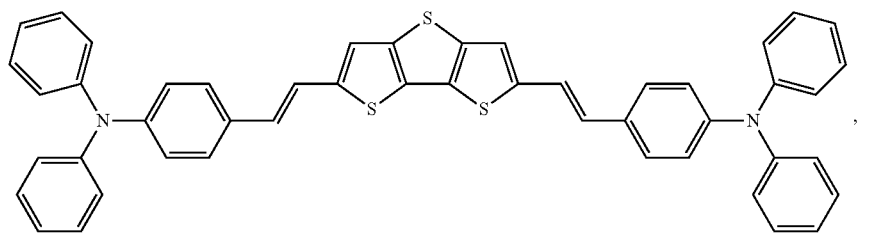
,
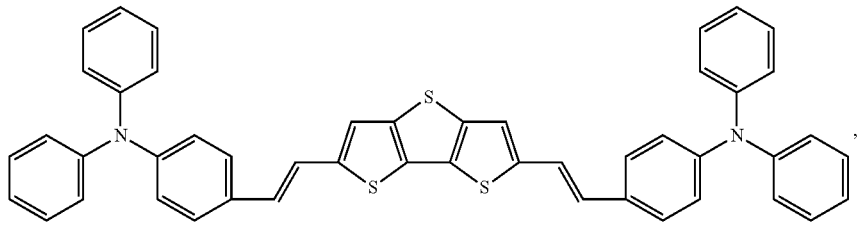
,
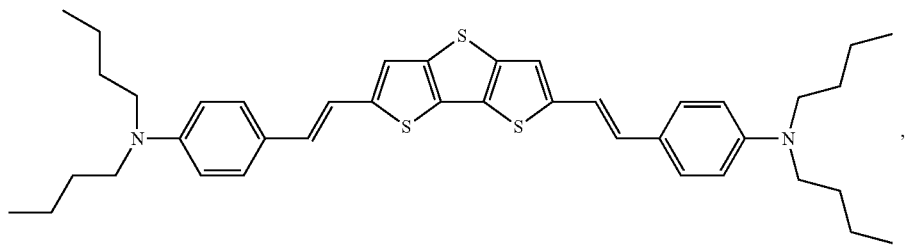
,
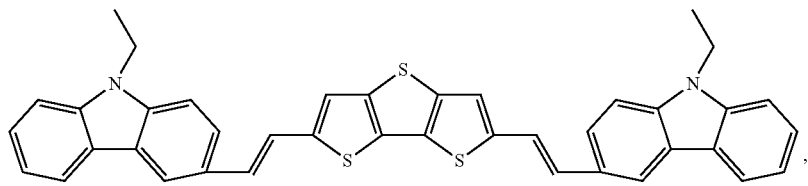
,
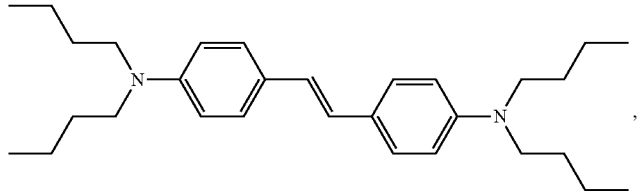
,
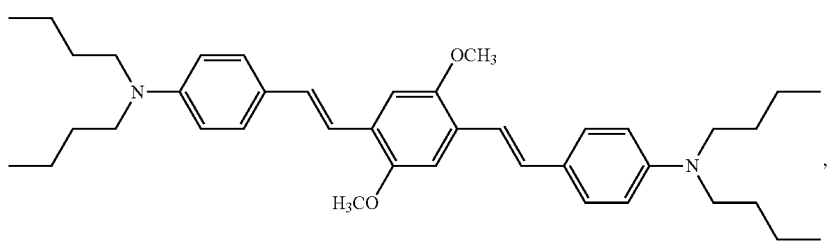
,
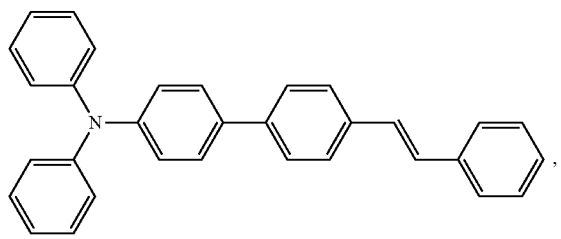 and 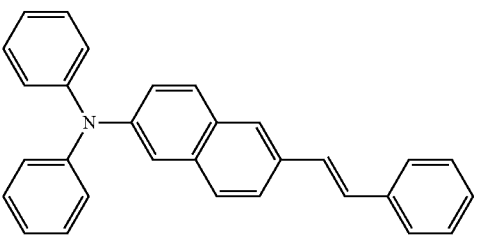 .

Such a two-photon photosensitizer may include both a polymerizable moiety (Y) and a two-photon absorbing moiety (X). The two-photon absorbing moiety (X) may have the following three structures:
(1) an electron donor-a π-electron center-an electron donor,
(2) an electron donor-a π-electron center-an electron acceptor, and
(3) an electron acceptor-a π-electron center-an electron acceptor.

In the structure, the electron donor may be ether, thiol ether, or amine, and the electron acceptor may be a nitrile group or a carbonyl group. The π-electron center may be selected from combined structures of benzene, thiophene, stilbene and azo units.

The two-photon absorbing moiety (X) may be prepared through additional polymerization of an unsaturated vinyl monomer, for example, styrene, acryl or methacryl, and a bicyclic monomer capable of being polymerized by ring opening.

The two-photon absorbing moiety (X) may have a sandwich configuration, in which a π-electron center, acting as a bridge for electron transfer, for example, an aromatic system or a conjugated unsaturated hydrocarbon system, may be substituted with an electron donor and/or an electron acceptor. Examples of the two-photon photosensitizer suitable for use in the example embodiments may include one or more selected from, but not limited to, the material group represented by Formula 1 below.

Formula 1

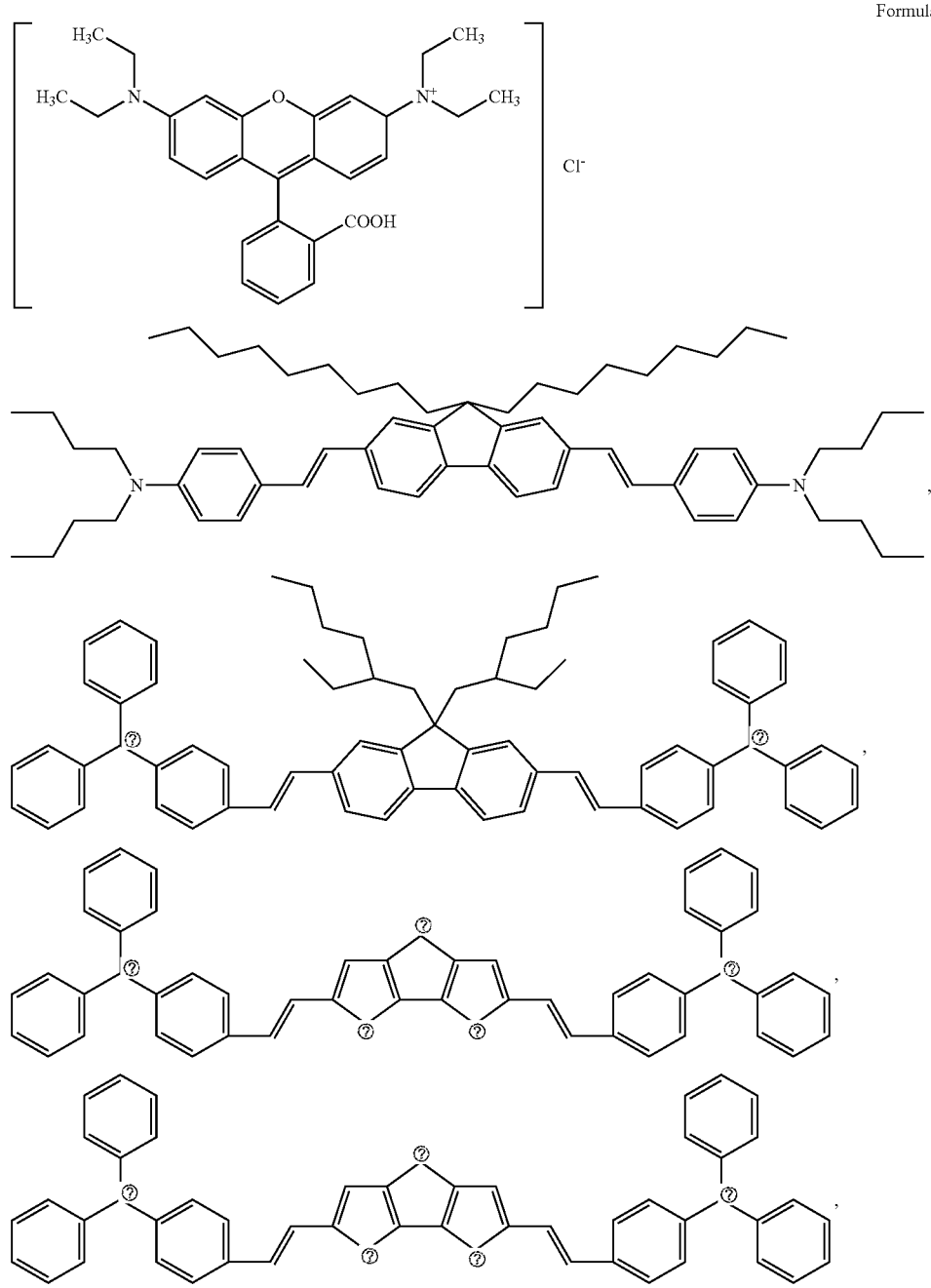

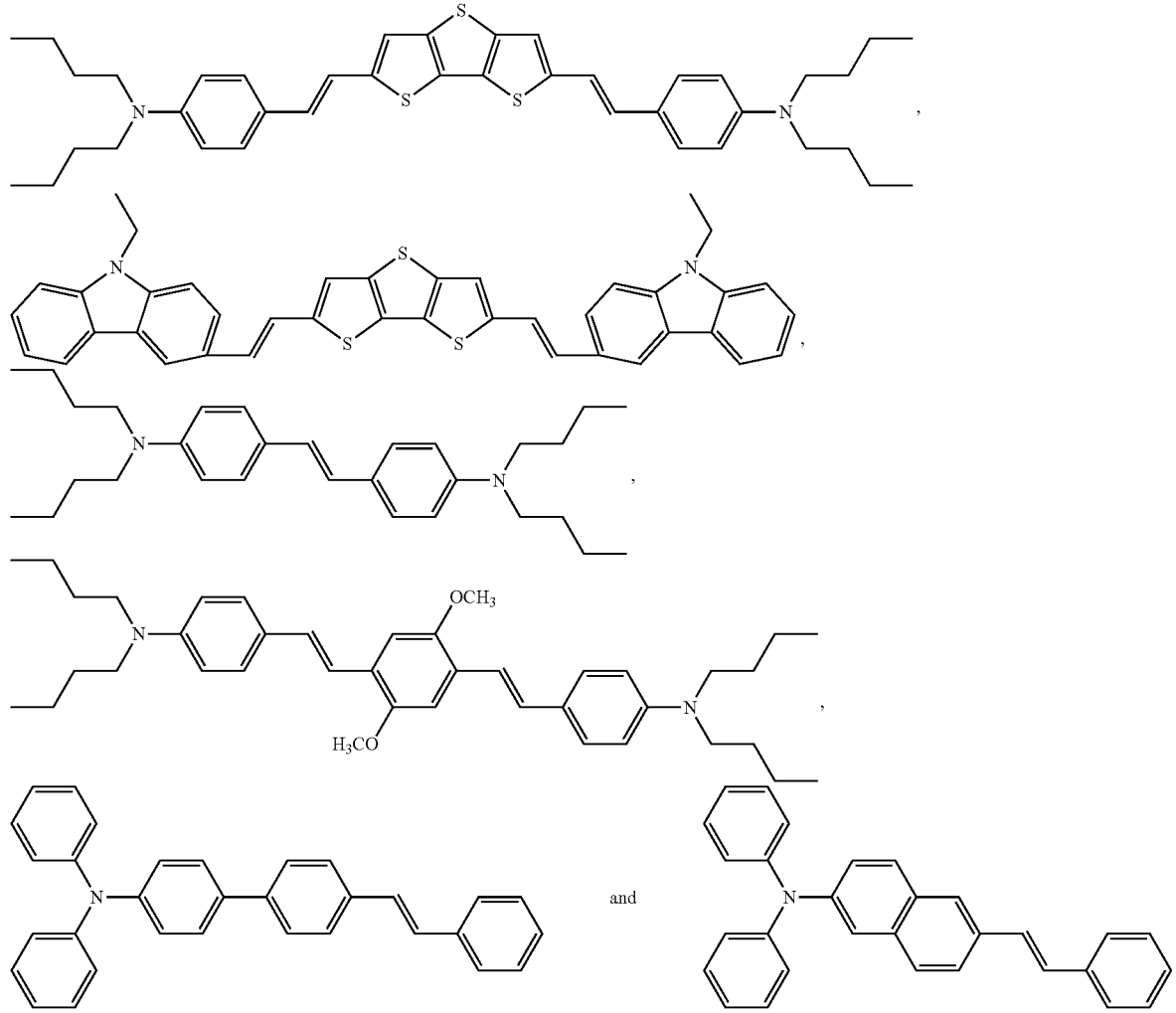

The two-photon photosensitizer may simultaneously absorb two photons to release twice as much energy as in one-photon absorption, so that the two-photon photosensitizer may be able to effectively excite molecules in the course of two-photon absorption.

Further, there may be a case in which the two-photon photosensitizer plays a role as a photoacid generator at the same time. The two-photon photosensitizer may produce an acid through laser or light radiation, after which the acid thus produced reacts with the oxirane group of the epoxy resin to thus cause ring-opening polymerization so that the epoxy resin may be crosslinked, thereby increasing mechanical properties, including tensile strength, elastic properties, and density.

The amount of the two-photon photosensitizer may be determined according to an appropriate choice made by one skilled in the art depending on the end use and need, and may be set in the range of about 0.1~about 10 wt %, for example, about 1~about 5 wt %, in consideration of the light stability of the composition, but is not limited thereto.

The organic solvent may include any organic solvent typically used in the art without limitation as long as it has improved miscibility and compatibility with the multifunctional epoxy resin and dissolves the silver compound. Examples thereof may include, but may be not necessarily limited to, non-photoreactive solvents, including γ-butyrolactone, cyclopentanone, xylene, $C_{1\sim6}$ acetate, tetrahydrofuran, dimethylformaldehyde, alcohol, e.g., ethyleneglycol, and mixtures of two or more thereof. The amount of the organic solvent may fall in the range of about 1~about 80 wt %, for example, about 20~about 50 wt %, based on the total amount of the photosensitive composition, in order to obtain a homogeneous compound.

The silver compound may include any compound containing silver particles, as long as it may be capable of dissolving in various organic solvents and may have improved miscibility with the multifunctional epoxy resin and the multifunctional acrylate resin below. Examples of the silver compound may include silver acetate, silver tetrafluoroborate, silver thiocyanate, silver trifluoromethanesulfonate, silver sulfate, silver phosphate, silver trifluoroacetate (STA), silver oxide (I), silver oxide (II), silver iodide, silver chloride, silver carbonate, silver hexafluorophosphate, silver nitride, silver fluoride, silver bromide, and silver hexafluoroantimonate, which may be used alone or in mixtures of two or more thereof.

The silver compound may be used in an amount of about 0.1~about 40 wt %, for example, about 1~about 10 wt % based on the total amount of the photosensitive composition. When the amount of the silver compound is about 0.1 wt % or more, sufficient silver nanoparticles may be obtained. Further, when the amount thereof may be about 40 wt % or less, the particles may not aggregate with each other, and the resolution of electronic part devices may be improved.

In addition, the photosensitive composition may further include a photoacid generator or a photoinitiator. The photoacid generator may include any photoacid generator, as long as an acid is produced using light, and examples thereof may include, but may be not limited to, onium photoacid generators, ionic photoacid generators including diphenyl iodonium salts of hydroxyl-containing aromatic sulfonic acid, DNQ (diazonaphthoquinone) photoacid generators, nonionic photoacid generators including nitrobenzyl sulfonic acid, and polymer photoacid generators, which may be used alone or in mixtures of two or more thereof.

The photoacid generator may produce an acid through laser or light radiation, after which the produced acid reacts with the oxirane group of the epoxy resin to thus cause ring-opening polymerization, so that the epoxy resin may be crosslinked. Accordingly, the dispersibility of the silver nanoparticles obtained in the course of microfabrication of the composition may be improved.

Specifically, the onium photoacid generator may have the structure represented by each of Formulas 2 to 12 below, and the ionic photoacid generator including diphenyl iodonium salt of hydroxyl-containing aromatic sulfonic acid may have the structure represented by Formula 13 below. The DNQ photoacid generator may have the structure of Formula 14 below, and the nonionic photoacid generator including nitrobenzyl sulfonic acid may have the structure of Formula 15 below. Also, the polymer photoacid generator may be a polymer having a molecular weight ranging from about 500 to about 1,000,000, in which a sulfonium salt or iodonium salt may be contained in the main chain or side chain thereof, or an organic photoacid generating group may be contained in the side chain thereof, thus generating acid with light.

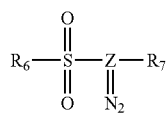

Formula 2 wherein $R_6$ and $R_7$ are each independently a linear, branched or cyclic $C_{1\sim10}$ alkyl group, and Z may be a sulfonyl group or a carbonyl group.

Examples of the compound having the structure of Formula 2 may include 1-cyclohexylsulfonyl-1-(1,1-dimethylethylsulfonyl)diazomethane, bis(1,1-dimethylethyl sulfonyl)diazomethane, bis(1-methylethylsulfonyl)methane, bis(cyclohexylsulfonyl)diazomethane, 1-cyclohexylsulfonyl-1-cyclohexylcarbonyldiazomethane, 1-diazo-1-cyclohexylsulfonyl-3,3'-dimethylbutan-2-one, 1-diazo-1-methylsulfonyl-4-phenyl butan-2-one, 1-diazo-1-(1,1-dimethylethylsulfonyl)-3,3-dimethyl-2-butanone, and 1-acetyl-1-(1-methylethylsulfonyl) diazomethane.

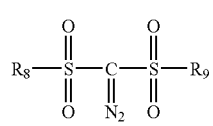

Formula 3 wherein $R_8$ and $R_9$ are each independently a hydrogen atom, a halogen atom, a linear or branched $C_{1\sim10}$ alkyl group, or a $C_{1\sim12}$ phenylalkyl group.

Examples of the compound having the structure of Formula 3 may include bis(cyclohexylsulfonyl)diazomethane, bis(p-toluenesulfonyl)diazomethane, methylsulfonyl-p-toluenesulfonyldiazomethane, 1-diazo-1-(p-toluenesulfonyl)-3,3-dimethyl-2-butanone, bis(p-chlorobenzenesulfonyl)diazomethane, and cyclohexylsulfonyl-p-toluenesulfonyldiazomethane.

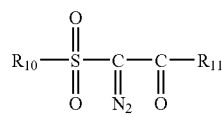

Formula 4 wherein $R_{10}$ and $R_{11}$ are each independently a hydrogen atom, a halogen atom, a linear or branched $C_{1\sim10}$ alkyl group, a $C_{1\sim12}$ phenylalkyl group, a phenyl group, or a tolyl group.

Examples of the compound having the structure of Formula 4 may include 1-cyclohexylsulfonyl-1-cyclohexylcarbonyl diazomethane, 1-p-toluenesulfonyl-1-cyclohexylcarbonyl diazomethane, 1-diazo-1-(p-toluenesulfonyl)-3,3-dimethylbutan-2-one, 1-diazo-1-benzenesulfonyl-3,3-dimethylbutan-2-one, and 1-diazo-1-(p-toluenesulfonyl)-3-methylbutan-2-one.

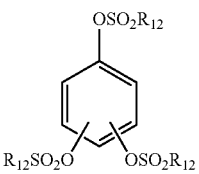

Formula 5 wherein $R_{12}$ is a $C_{1\sim12}$ phenylalkyl group or a phenyl group.

Examples of the compound having the structure of Formula 5 may include 1,2,3-tris(trifluoromethanesulfonyloxy)benzene, trifluoromethanesulfonyloxy)benzene, 1,2,3-tris(2-chloroethane sulfonyloxy)benzene, 1,2,3-tris(p-trifluorobenzenesulfonyloxy)benzene, 1,2,3-tris(p-nitnobenzenesulfonyloxy)benzene, 1,2,3-tris(2,3,4,5-pentafluorobenzenesulfonyloxy)benzene, 1,2,3-tris(p-fluorobenzenesulfonyloxy)benzene, 1,2,3-tris(methanesulfonyl oxy)benzene, 1,2,4-tris(p-trifluoromethyloxybenzenesulfonyloxy)benzene, 1,2,4-tris(2,2,2-trifluoromethanesulfonyloxy)benzene, 1,2,4-tris(2-thienylsulfonyloxy)benzene, 1,3,5-tris(methane sulfonyloxy)benzene, 1,3,5-tris(trifluoromethanesulfonyloxy)benzene, 1,3,5-tris(2,2,2-trifluoromethanesulfonyloxy)benzene, 1,3,5-tris(p-nitrobenzenesulfonyloxy)benzene, 1,3,5-tris (2,3,4,5,6-pentafluorobenzenesulfonyloxy)benzene, 1,3,5-tris(p-fluorobenzenesulfonyloxy)benzene, and 1,3,5-tris(2-chloroethane sulfonyloxy)benzene.

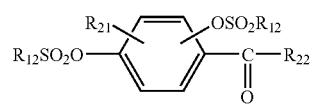

Formula 6 wherein $R_{12}$, $R_{21}$ and $R_{22}$ are each independently a $C_{1\sim12}$ phenylalkyl group or a phenyl group.

Examples of the compound having the structure of Formula 6 may include 2,3,4-tris(p-fluorobenzene sulfonyloxy) benzophenone, 2,3,4-tris(trifluoromethanesulfonyl oxy)benzophenone, 2,3,4-tris(2-chloroethanesulfonyloxy) benzophenone, 2,3,4-tris(p-trifluoromethylbenzenesulfonyloxy)benzophenone, 2,3,4-tris(p-nitrobenzenesulfonyloxy) benzophenone, 2,3,4-tris(p-fluorobenzenesulfonyloxy)acetophenone, 2,3,4-tris(2,3,4,5,6-pentafluorobenzenesulfonyl oxy)acetophenone, 2,3,4-tris(2-nitrobenzenesulfonyloxy) acetophenone, 2,3,4-tris(2,5-dichlorobenzenesulfonyloxy)acetophenone, 2,3,4-tris(2,3,4-trichlorobenzenesulfonyloxy)acetophenone, 2,2',4,4'-tetra(methanesulfonyloxy)benzophenone, 2,2',4,4'-tetra(2,2,2-trifluoromethanesulfonyloxy)benzophenone, 2,2',4,4'-tetra(2-chloroethanesulfonyloxy)benzophenone, 2,2',4,4'-tetra(2,5-dichlorobenzenesulfonyloxy)benzophenone, 2,2',4,4'-tetra(2,4,6-trimethylbenzenesulfonyloxy)benzophenone, and 2,2',4,4'-tetra(m-trifluoromethylbenzenesulfonyloxy) benzophenone.

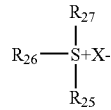

Formula 7 wherein $R_{25}$, $R_{26}$ and $R_{27}$ are each independently a $C_{1\sim12}$ phenylalkyl group or a phenyl group, and X is methanesulfonate, trifluoromethanesulfonate, p-toluenesulfonate, 10-camphorsulfonate, cyclohexanesulfamate, perfluoro-1-butanesulfonate, Cl, Br, $SbF_6$, $BF_4$, $PF_6$, or $AsF_6$.

Examples of the compound having the structure of Formula 7 may include triphenylsulfonium trifluoromethanesulfonate, triphenylsulfonium perfluorooctane sulfonate, diphenyl-p-tolylsulfonium perfluorooctanesulfonate, tris(p-tolyl)sulfonium perfluorooctanesulfonate, tris(p-chlorobenzene)sulfonium trifluoromethanesulfonate, tris(p-tolyl)sulfonium trifluoromethanesulfonate, trimethylsulfonium trifluoromethanesulfonate, dimethylphenylsulfonium trifluoro methanesulfonate, dimethyltolylsulfonium trifluoromethane sulfonate, dimethyltolylsulfonium perfluorooctanesulfonate, triphenylsulfonium p-toluenesulfonate, triphenylsulfonium methanesulfonate, triphenylsulfonium butanesulfonate, triphenylsulfonium n-octanesulfonate, triphenylsulfonium 1-naphthalenesulfonate, triphenylsulfonium 2-naphthalenesulfonate, triphenylsulfonium 10-camphorsulfonate, triphenylsulfonium 2,5-dichlorobenzenesulfonate, diphenyltolylsulfonium 1,3,4-trichlorobenzenesulfonate, dimethyltolylsulfonium p-toluenesulfonate, diphenyltolyl sulfonium 2,5-dichlorobenzenesulfonate, triphenylsulfonium chloride, triphenylsulfonium bromide, triphenylsulfonium tetrafluoroborate, triphenylsulfonium pentafluoroantimonate, triphenylsulfonium pentafluorophosphate, and triphenylsulfonium pentafluoroarsenate.

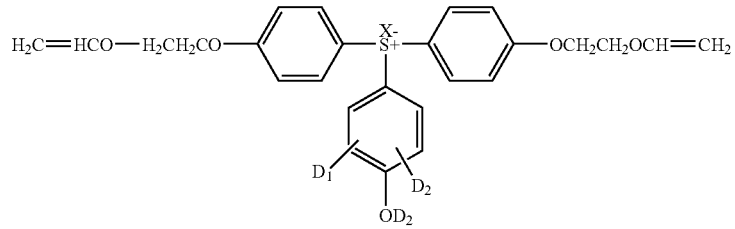

Formula 8 wherein X is methanesulfonate, trifluoromethanesulfonate, p-toluenesulfonate, 10-camphorsulfonate, cyclohexanesulfamate, perfluoro-1-butanesulfonate, Cl, Br, $SbF_s$, $BF_4$, $PF_6$ or $AsF_6$, and $D_1$ and $D_2$ are each independently a hydrogen atom, a $C_{1\sim6}$ alkyl group, or a vinyloxymethyl group.

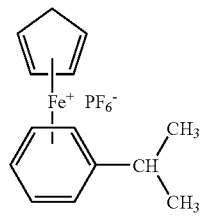

Formula 9 wherein R is a $C_{1\sim10}$ alkyl group, and $MX_n$- is $BF_4$—, $PF_6$—, $AsF_6$- or $SbF_6$—.

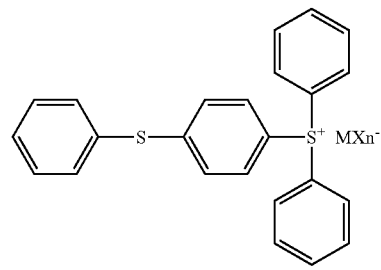

Formula 10

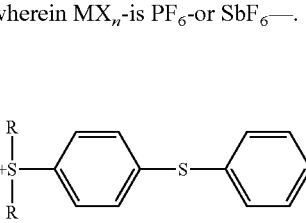

Formula 11 wherein $MX_n$- is $PF_6$- or $SbF_6$—.

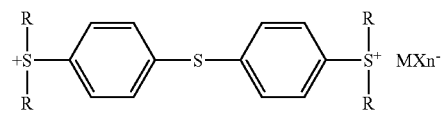

Formula 12 wherein R is a $C_{1\sim10}$ alkyl group, and $MX_n$- is $PF_6$- or $SbF_6$—.

Formula 13

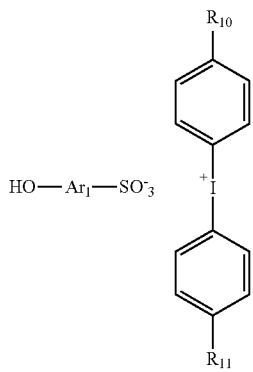

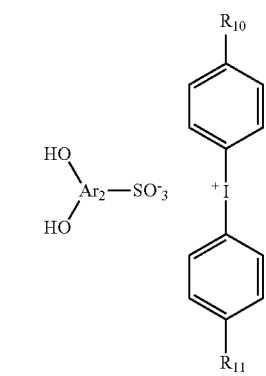

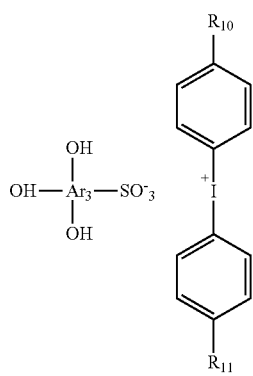

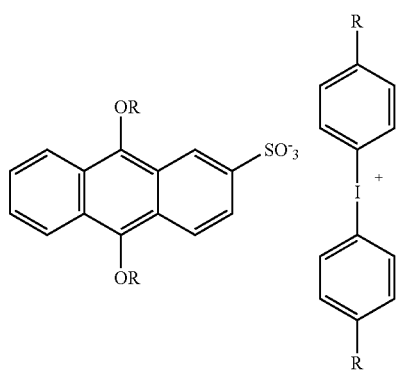

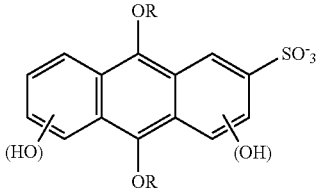
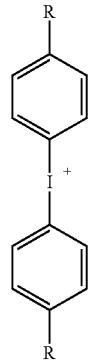

wherein R, $R_{10}$ and are each independently a $C_{1\sim12}$ alkyl or alkoxy group, or a hydroxyl group, and $Ar_1$, $Ar_2$ and $Ar_3$ are each independently a phenyl group, a naphthalene group, or an anthracene group.

Formula 14

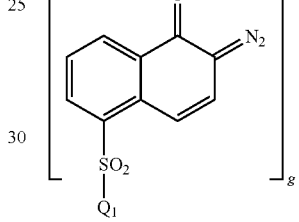 or 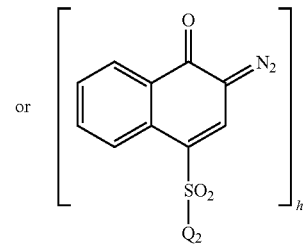

wherein $Q_1$ and $Q_2$ are each independently a $C_{1\sim12}$ alkyl or aryl group, and g and h are each independently an integer of 1 or more.

Formula 15

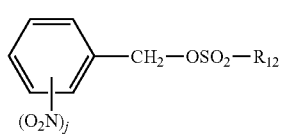

wherein $R_{12}$ is a $C_{1\sim12}$ alkyl or aryl group containing a heteroatom, and j is an integer from 1 to 3.

The amount of the photoacid generator may be determined according to an appropriate choice made by one skilled in the art depending on the end use and need. In consideration of the UV stability of the composition, the photoacid generator may be used in an amount of about 0.1~about 10 wt %, for example, about 1~about 5 wt %, based on the total amount of the photosensitive composition, but may not be limited thereto.

In example embodiments, in the case of the photosensitive composition including the multifunctional acrylate resin and the photoinitiator, the multifunctional acrylate resin may be crosslinked by the photoinitiator.

In example embodiments, in the case of the photosensitive composition including the multifunctional acrylate resin, the multifunctional epoxy resin, the photoacid generator, and the photoinitiator, the epoxy resin may be crosslinked and the acrylate resin may also be crosslinked in the course of microfabrication of the photosensitive composition, thus forming an interpenetrating polymer network (IPN) along with the crosslinked epoxy resin. Ultimately, the crosslink density of the exposed portion, chemical resistance to ink, and hardness may be further increased.

The photoinitiator may include any initiator able to produce a radical using light, and examples thereof may include one or more selected from the group consisting of triazine compounds, benzophenone compounds, acetophenone compounds, thioxanthone compounds, benzoin compounds, carbazole compounds, diketone compounds, sulfonium borate compounds, diazo compounds, and biimidazole compounds.

Examples of the triazine compound may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphtho-1-yl)-4,6-bis(trichloro methyl)-s-triazine, 2-(4-methoxynaphtho-1-yl)-4,6-bis(trichloromethyl)-s-triazine, 2-4-trichloromethyl (piperonyl)-6-triazine, and 2-4-trichloromethyl(4'-methoxystyryl)-6-triazine.

Examples of the benzophenone compound may include benzophenone, benzoyl benzoate, methyl benzoyl benzoate, 4-phenyl benzophenone, hydroxyl benzophenone, acrylated benzophenone, 4,4'-bis(dimethylamino)benzophenone, and 4,4'-bis(diethylamino)benzophenone, and examples of the acetophenone compound may include 2,2'-diethoxyacetophenone, 2,2'-dibutoxyacetophenone, 2-hydroxy-2-methylpropiophenone, p-t-butyltrichloroacetophenone, p-t-butyldichloroacetophenone, 4-chloroacetophenone, 4,4'-dimethylaminobenzophenone, 4,4'-dichlorobenzophenone, 3,3'-dimethyl-2-methoxybenzophenone, 2,2'-dichloro-4-phenoxyacetophenone, 2-methyl-1-(4-(methylthio)phenyl)-2-morpholinopropan-1-one, and 2-benzyl-2-dimethylamino-1-(4-morpholinophenyl)-butan-1-one.

Examples of the thioxanthone compound may include thioxanthone, 2-chloro thioxanthone, 2-methylthioxanthone, isopropyl thioxanthone, 2,4-diethyl thioxanthone, 2,4-diisopropyl thioxanthone, and 2-chlorothioxanthone, and examples of the benzoin compound include benzoin, benzoin methylether, benzoin ethylether, benzoin isopropyl ether, benzoin isobutyl ether, and benzyl dimethylketal. Such a photoinitiator may be used in an amount of about 0.1~about 20 wt %, for example, about 1~about 5 wt %, based on the total amount of the composition.

Also, the composition according to example embodiments may further include an additive. The additive may be at least one material selected from the group consisting of a surfactant, a flow improver, and a viscosity modifier, which may be suitable for further increasing the dispersibility and adhesiveness of silver nanoparticles, a silane coupling agent suitable for increasing the adhesion to the substrate, and a dye, a pigment, and a UV absorbent, which may be suitable for controlling the absorption coefficient. This additive may be used in an amount of about 0.05~about 10 wt %, for example, about 1~about 5 wt %.

In accordance with example embodiments, a microfabrication method may be provided, which may include preparing the photosensitive composition as above, and subjecting a portion of the photosensitive composition to microfabrication under conditions effective for two- or three-dimensional fabrication. The microfabrication procedure may be the fabrication of the composition on a nanometer or micrometer scale, and may be conducted using laser or light radiation.

In the microfabrication method according to example embodiments, the photosensitive composition including the two-photon photosensitizer may be used, thereby improving precision. As mentioned above, in two-photon absorption, two photons may be simultaneously absorbed, thus enabling the selective excitation of molecules present at deeper positions in the material using a depth-focused light source. Where two-photon absorption is used, laser energy may be amplified, and only portions around the focal points of laser light may be cured, and as a result, precision on the order of tens of nanometers may be achieved, and a three-dimensional structure with a relatively high spatial resolution may also be formed.

In the microfabrication method, in the course of microfabrication of the composition, which may include the silver compound, the multifunctional photosensitive resin, and the two-photon photosensitizer dissolved in the organic solvent using laser or light radiation, through electron transfer by a radical generated from the two-photon photosensitizer or other materials, the silver compound may be photoreduced to thus form the silver nanoparticles, and simultaneously, the photosensitive resin may be crosslinked such that the silver nanoparticles may be uniformly incorporated into the polymer structure to thus be uniformly dispersed, thereby obtaining a microfabricated structure, the physical and chemical properties of which, including heat resistance, thermal conductivity, wear resistance, and dispersibility, may be improved. Accordingly, because the silver nanoparticles may be formed in situ through photoreduction using laser or light radiation, and, simultaneously, as the photosensitive resin, the epoxy resin or the acrylate resin may be crosslinked to thus obtain the crosslinked polymer resin in which the silver nanoparticles may be uniformly distributed, there may be no need to separately prepare nanocrystals, and therefore, the process may be simplified, and the dispersibffity of the nanoparticles may be improved compared to particles containing the nanocrystals.

Below, the microfabrication method according to example embodiments may be illustratively described, but the scope of example embodiments may not be limited thereto. For example, in the case of the two-dimensional microfabrication method, the photosensitive composition may be applied on a substrate and may be then dried, thus forming a thin film, after which the thin film may be irradiated with light through a photo mask for selective exposure, and may then be developed, thereby forming a desired pattern.

In the exposure, light may be UV or deep UV having a wavelength of about 400 nm or less, and a light source for emitting such light may include a mercury lamp (365 nm), a KrF laser (248 nm), an ArF excimer laser (193 nm), or a femtosecond laser, e.g., a Ti:Sapphire (780 nm) laser. The silver nanoparticles may be formed through photoreduction by the exposure, and the size and dispersibility of the silver nanoparticles may vary depending on the time and amount of exposure.

The exposed film may have an unexposed portion corresponding to the pattern and an exposed portion corresponding to the portion other than the pattern. The exposed portion may be formed by reacting the acid produced from the two-photon photosensitizer through light radiation with the epoxy group of the epoxy resin to thus cause ring-opening polymerization, thereby crosslinking and curing the epoxy resin, and simultaneously reducing the silver compound through electron transfer using the radical generated from the two-photon photosensitizer or other materials to thus form the silver nanoparticles. As such, the crosslinking between the organic solvent and the epoxy resin (or acrylate resin) may prevent or reduce the aggregation of the silver nanoparticles. Conversely, the unexposed portion may remain because the epoxy resin (and acrylate resin) may not be crosslinked, but may remain as a monomer or an oligomer. Thus, the unexposed portion may be dissolved in a developing solution in a subsequent development process, and may be thus removed.

In order to remove the remaining organic solvent, post baking may be conducted after exposure, as necessary. The post baking may be performed at about 70~about 300° C., for example, about 100~about 200° C. for a period of time ranging from about 30 seconds to about 5 minutes. Then, the exposed film may be developed using a developing solution to remove the unexposed portion, thereby obtaining a two-dimensional structure containing silver nanoparticles with a desired negative pattern. Post curing may be conducted to further cure the exposed portion and remove the remaining developing solution, as necessary. The post curing may be performed at about 100~about 400° C., but may be not limited thereto.

The three-dimensional microfabrication method may include laser-patterning the microfabricated structure, resulting from two-dimensional microfabrication, through z-axis position control, or coating a substrate with the photosensitive composition or dropping a predetermined amount of the photosensitive composition on a substrate, and then conducting drying and patterning using a three-dimensional microfabrication process, but example embodiments may not be limited thereto, and methods typically used in the art may be conducted.

The coating for three-dimensional microfabrication may be carried out through nano-imprint lithography, microcontact printing, replica molding, or microtransfer molding. The desired three-dimensional shape may be machined through the above process and may then be exposed to UV light or laser, thus forming the three-dimensional structure containing silver nanoparticles.

FIG. 1 is a schematic view showing the system for the microfabrication method. The three-dimensional microfabrication method using microstereolithography may be a method of manufacturing a three-dimensional CAD model having a predetermined or given shape into a physical model. The microstereolithography may enable the formation of a three-dimensional structure on a nanometer or micrometer scale, which may be difficult or impossible to manufacture through conventional lithographic methods. In order to assure precision, the three-dimensional structure having less precision than the diffraction limit of light using two-photon absorption may be formed. In the case of microstereolithography using a laser, two-photon polymerization may be conducted using a laser beam. The two-photon absorption may be a phenomenon in which only portions having relatively high peak power of laser light receive and absorb two-photon energy. Accordingly, only portions around the focal points of laser light may be cured, thereby assuring precision. With reference to FIG. 1, two galvano mirrors may be used to pass the focal points of the laser beam in horizontal and vertical directions through a lens having a predetermined or given opening ratio to photocure a portion of the photosensitive composition, resulting in a three-dimensional structure. As such, the focal point of the laser beam may be controlled through a monitor and a computer.

Nanoimprint lithography (NIL) is a method of transferring a nanostructure by imprinting a nanostructure-imprinted stamp on the surface of a resist, subjected to spin coating or dispensing, on a substrate. For example, the nanostructure-imprinted stamp, composed of a transparent material, may be manufactured, and an anti-adhesion film may be formed. A primer layer may be formed, and a photocurable resin may be applied on the substrate, after which the stamp may be imprinted while radiating UV light having a wavelength of about 300~about 400 nm, thus curing the photosensitive composition. The imprinted polymer thin film may be developed, consequently forming the three- or two-dimensional nanostructure.

Another method using the stamp may include soft lithography, and specific examples thereof include microcontact printing, replica molding, microtransfer molding, micromolding in capillaries, or solvent-assisted micromolding, in order to form the three-dimensional structure.

In example embodiments, after the microfabrication procedure using laser or light radiation, the produced structure may be heated. In the microfabrication method, a portion of the photosensitive composition may be photoreduced using laser or light radiation, thus forming the silver nanoparticles. The silver nanoparticles may have a relatively small size on the scale of ones of nanometers. However, in order to use such a structure, a structure on a scale larger than ones of nanometers may be required. When the microfabricated structure containing the silver nanoparticles formed using laser or light radiation is heated, reduction may be caused by heat so that the silver nanoparticles distributed in the patterned structure may act as a crystallizing nucleus to thus agglomerate the nanoparticles with each other, thus growing the microfabricated silver nanoparticles. The size of the silver nanoparticles may be adjusted through the heating time and temperature.

The structure thus microfabricated may include the silver nanoparticles, which may be uniformly dispersed in the polymer resin, thereby exhibiting improved heat resistance, thermal conductivity and wear resistance, and as well, may be manufactured from the photocurable composition including the epoxy resin or acrylate resin and the photoacid generator or photoinitiator, thereby realizing increased crosslink density, resulting in improved mechanical strength, resistance to corrosion by ink, and force of adhesion to the substrate. Therefore, the microfabricated structure containing the silver nanoparticles may be variously applied to all kinds of electronic part devices and optical devices, for example, ink-jet printer heads, RFID circuitry, PCB circuits, and electronic circuits.

Further, the microfabricated structure, which may be patterned on a nanometer scale through the above method, may exhibit surface plasmon resonance, which may be a characteristic unique to metal nanoparticles. Surface plasmon resonance may be a phenomenon in which collective vibration of free electrons is induced along the interface between the metal and the dielectric material by electromagnetic waves, and may be utilized to realize electrical and optical properties in displays and electronic devices.

A better understanding of example embodiments may be obtained in light of the following examples, which may be set forth to illustrate, but may not be construed as limiting example embodiments.

EXAMPLE 1

Formation of Three-Dimensional Microstructure Containing Silver Nanoparticles

Figure 2:
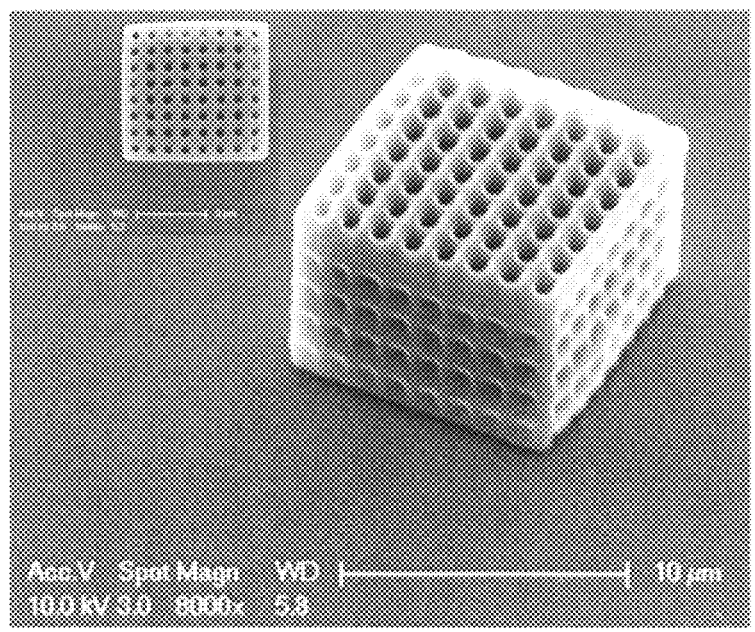

A photosensitive composition, comprising about 10 g of a multifunctional epoxy resin (SU-8, Shell Chemicals), about 0.7 g of Rhodamine B, about 50 g of γ-butyrolactone as an organic solvent, about 1 g of silver oxide (Aldrich), 0.1 g of the photoacid generator of Formula 16 below, and about 0.01 g of an antifoaming agent (KS-66, Shin-Etsu Chemical) as an additive, was prepared. The composition was sonicated for about 1 hour, so that respective components were sufficiently mixed, filtered with an about 0.5 μm syringe, subjected to spin coating at about 3000 rpm on glass surface-treated with $CF_4$ plasma, and then dried at about 120° C. for about 3 minutes to remove the organic solvent remaining on the coated surface. A desired three-dimensional pattern of the film was formed using a Ti:Sapphire 780 nm laser beam, and the x- and y-axes of the laser beam were controlled by means of a galvano scanner having about 1.2 nm resolution. Two galvano mirrors were used to pass the laser beam in horizontal and vertical directions through a lens having a predetermined or given opening ratio at intervals of about 80 fs to photocure the photosensitive composition at regular rates. The control of the laser beam in the z-axis direction was conducted using a piezoelectric stage such that the pattern had an interlayer spacing on the level of about 10 nm. Further, the irradiation time of the laser beam was controlled to a level of about 1 ms through coupling of a galvano shutter and a pin hole. The pattern formation procedure was monitored using a CCD camera provided with a high magnification lens (×1000). The three-dimensional shape of the pattern was constructed by successively forming voxels along two-dimensional plane coordinates to thus manufacture a layer, moving the galvano scanner by the interlayer spacing in the z-axis direction using the piezoelectric stage, and manufacturing another layer. As such, the voxels were cured by two-photon polymerization of the photocurable resin in a liquid phase, individual unit voxels directly affecting the precision of the three-dimensional shape. Subsequently, the pattern was developed using propylene glycol methyl ether acetone (PGMEA) and washed with IPA, thus forming the three-dimensional structure seen in FIG. 2. Formula 16

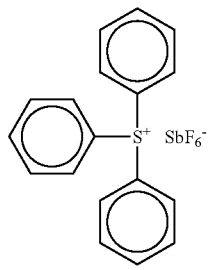

EXAMPLE 2

Formation of Three-Dimensional Microstructure Containing Silver Nanoparticles

A three-dimensional microstructure was fabricated in the same manner as in Example 1, with the exception that about 10 g of urethane acrylate (SCR-500, Japan Synthetic Rubber Co. Ltd.) was used instead of the multifunctional epoxy resin, about 0.2 g of benzophenone was used as a photoinitiator instead of the photoacid generator, and a fluorene derivative was used as the two-photon photosensitizer.

EXAMPLE 3

Formation of Three-Dimensional Microstructure Containing Silver Nanoparticles

A three-dimensionally microstructure was fabricated in the same manner as in Example 1, with the exception that about 10 g of urethane acrylate (SCR-500, Japan Synthetic Rubber Co. Ltd.) was used instead of the multifunctional epoxy resin, about 0.3 g of 2,4-diethyl thioxanthone was used as a photoinitiator instead of the photoacid generator, and about 3 g of silver trifluoroacetate (Aldrich) was used instead of silver oxide (Aldrich).

*Evaluation of Properties of Microfabricated Structure*

Figure 3:
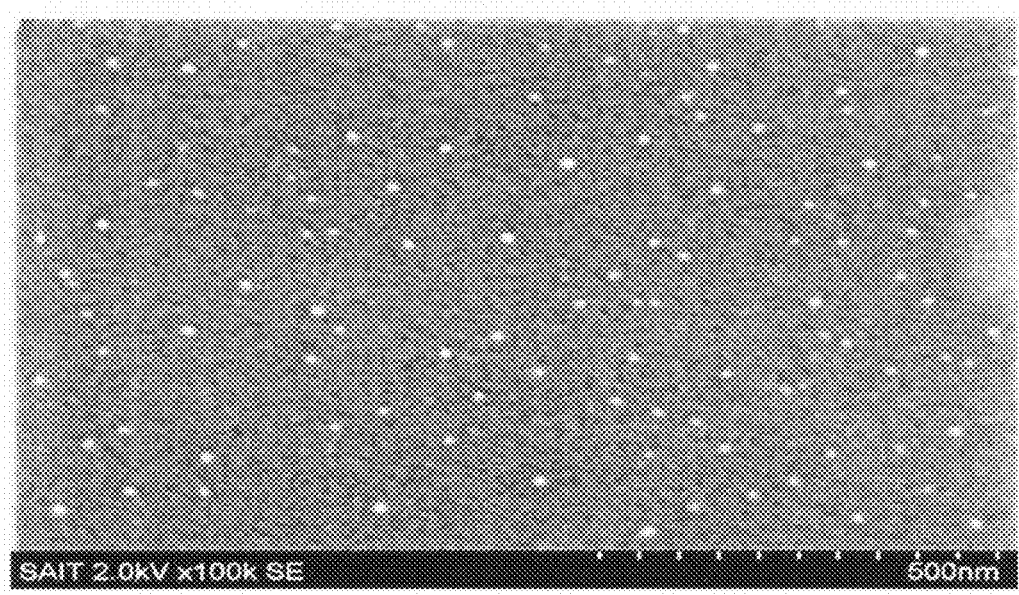

In order to test whether the microfabricated structure of Example 1 actually contained silver nanoparticles, the structure was observed using an SEM. The results may be shown in FIG. 3. With reference to FIG. 3, the silver nanoparticles were in an agglomerated form of about 10~about 30 nm on the surface of the microfabricated structure.

Although example embodiments have been disclosed for illustrative purposes, those skilled in the art will appreciate that various modifications, additions and substitutions may be possible, without departing from the scope and spirit of example embodiments as disclosed in the accompanying claims.

What is claimed is:

1. A method of fabricating a microfabricated structure, comprising:
    preparing a photosensitive composition including a multifunctional photosensitive resin, a two-photon photosensitizer, an organic solvent, and a silver compound; and
    subjecting a portion of the photosensitive composition to microfabrication under conditions effective for two- or three-dimensional fabrication.

2. The method of claim 1, wherein the microfabrication of the microfabricated structure is conducted through fabrication of the composition on a nanometer or micrometer scale.

3. The method of claim 1, wherein the microfabrication of the microfabricated structure includes forming silver nanoparticles using laser or light radiation.

4. The method of claim 1, further comprising:
    heating the produced structure after the microfabrication of the microfabricated structure.

5. The method of claim 1, wherein the three-dimensional fabrication is conducted through nano-imprint lithography, microcontact printing, replica molding, microtransfer molding, or microstereolithography.

* * * * *